United States Patent

[11] 3,581,235

[72] Inventor Paul Y. Siu
Los Angeles, Calif.
[21] Appl. No. 800,411
[22] Filed Feb. 19, 1969
[45] Patented May 25, 1971
[73] Assignee Burroughs Corporation
Detroit, Mich.

[54] CRYSTAL STABILIZED HIGH FREQUENCY TRANSISTOR MULTIVIBRATOR
10 Claims, 2 Drawing Figs.

[52] U.S. Cl. .......... 331/113,
331/116, 331/144, 331/159
[51] Int. Cl. .......... H03b 5/36,
H03k 3/282
[50] Field of Search .......... 331/113,
116, 159, 144

[56] References Cited
UNITED STATES PATENTS
3,217,269 11/1968 Rowley et al. .......... 331/113

FOREIGN PATENTS
112,404 10/1964 Czechoslovakia .......... 331/116
545,901 3/1932 Germany .......... 331/159

*Primary Examiner*—Roy Lake
*Assistant Examiner*—Siegfried H. Grimm
*Attorney*—Christie, Parker & Hale

ABSTRACT: An astable multivibrator operating in a current mode comprising two transistors with resistive cross-coupling between each collector and the other base and capacitive cross-coupling between emitters. The natural frequency of the multivibrator is determined by the emitter resistors and the cross-coupling capacitance, which is preferably adjustable. A crystal having a parallel resonant overtone mode at the desired frequency of operation of the oscillator is connected between the bases of the transistors. The cross-coupling capacitance is adjusted so that the natural frequency of the multivibrator is slightly higher than the resonant frequency of the crystal.

INVENTOR.
PAUL Y. SIU
BY Christie, Parker & Hale
ATTORNEYS

CRYSTAL STABILIZED HIGH FREQUENCY TRANSISTOR MULTIVIBRATOR

BACKGROUND OF THE INVENTION

This invention relates to the generation of high frequency electrical oscillations and, more particularly, to an oscillator having a highly stable frequency of operation.

The classic oscillator, which employs a single active circuit element such as a transistor and an inductance-capacitance tank circuit connected in a positive feedback path from the output to the input of the active element, has in the past found use both in high and low frequency applications. Since the advent of integrated circuits and printed circuit boards, this classic oscillator has lost favor because the inductor required for the tank circuit occupies too much space and is expensive to purchase and assemble.

As astable multivibrator is an attractive alternative to the classic oscillator because it oscillates without an inductor. Generally, astable multivibrators operate in one of two modes, depending upon their circuit configuration. The so-called saturation mode is well suited for generating low frequency oscillations in the kilohertz range and the so-called current mode is well suited for generating high frequency oscillations in the megahertz range.

In the design of any astable multivibrator, attention must be given to the stability of the operating frequency, which is dependent upon the stability and tolerances of the resistors and capacitors forming the timing circuits. The stability problem is particularly serious in the design of an oscillator for use as a clock source in a digital computer.

SUMMARY OF THE INVENTION

The invention contemplates the use of a crystal that has a parallel resonant mode to stabilize the frequency of an astable multivibrator operating in a current mode. Preferably an overtone mode of the crystal is used, if the desired frequency of operation is high. Specifically, the multivibrator comprises a pair of transistors with resistive cross-coupling between each collector and the opposite base and capacitive cross-coupling between the emitters. The natural frequency of operation of the multivibrator is determined by the emitter resistors and the cross-coupling capacitance. The crystal is connected between the bases of the transistors. Its parallel resonant frequency is slightly lower than the natural frequency of the astable multivibrator. Consequently, the multivibrator is forced to oscillate at the resonant frequency of the crystal, which is inherently very stable, rather than at its natural frequency.

The cross-coupling capacitance is preferably adjustable. Consequently, a single adjustment permits the natural frequency of operation of the astable multivibrator to be set so it is at the desired increment above the resonant frequency of the crystal.

BRIEF DESCRIPTION OF THE DRAWING

The features of a specific embodiment of the best mode contemplated of carrying out the invention are illustrated in the drawing, in which.

DETAILED DESCRIPTION OF THE SPECIFIC EMBODIMENT

Figure 1:
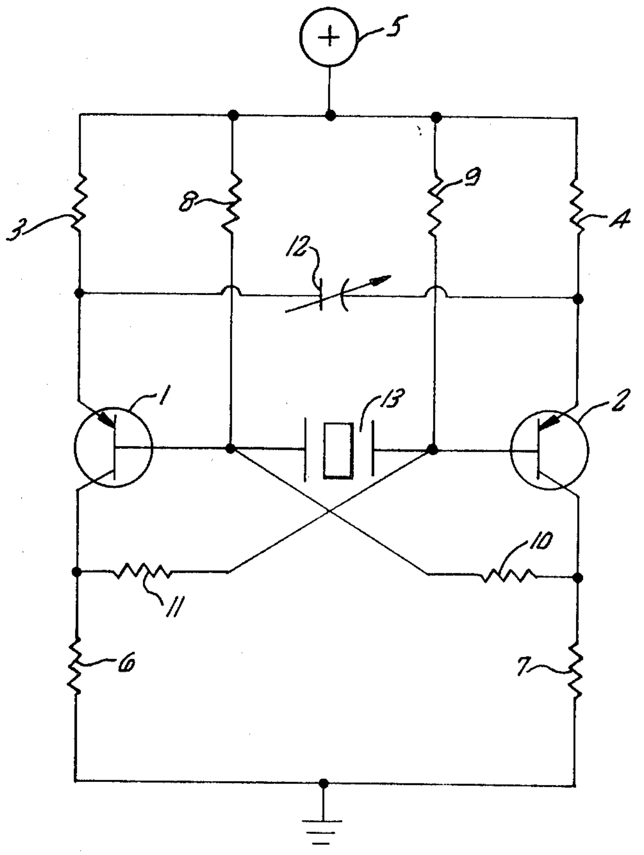
FIG. 1 is a schematic circuit diagram of an oscillator incorporating the principles of the invention.

In FIG. 1, transistors 1 and 2 are shown. Resistors 3 and 4 connect the emitters of transistors 1 and 2, respectively, to a source 5 of positive bias potential. Resistors 6 and 7 connect the collectors of transistors 1 and 2, respectively, to ground. Resistors 8 and 9 connect the bases of transistors 1 and 2, respectively, to source 5. A resistor 10 cross-couples the collector of transistor 2 to the base of transistor 1, and a resistor 11 cross-couples the collector of transistor 1 to the base of transistor 2. An adjustable capacitor 12 cross-couples the emitters of transistors 1 and 2. These components comprise an astable multivibrator. A crystal 13 is connected between the bases of transistors 1 and 2.

Neglecting at first the presence of crystal 13, the circuit of FIG. 1 operates as follows: When transistor 2 is conducting and transistor 1 is cut off, capacitor 12 charges through resistor 3. As capacitor 12 charges, the positive potential at the emitter of transistor 1 increases until the emitter-to-base junction of transistor 1 becomes forward biased. At such time regeneration commences. Transistor 1 beings to conduct, thereby increasing the positive potential at its collector. The increase in positive potential at the collector of transistor 1 is coupled to the base of transistor 2 to reduce the forward bias of its emitter-to-base junction. Thus, transistor 2 conducts less, and the positive potential at its collector decreases. The decrease in the positive potential at the collector of transistor 2 further increases the forward bias of the emitter-to-base junction of transistor 1. This regenerative process quickly proceeds to drive transistor 2 into cutoff. Then, capacitor 12 charges through resistor 4, the positive potential at the emitter of transistor 2 rising until transistor 2 begins to conduct again. When transistor 2 begins to conduct again, transistor 1 is driven into cutoff by regeneration regeneration in the manner described above in connection with transistor 2. This cycle is continuously repeated at the natural frequency of the astable multivibrator, which is determined by the resistance of resistors 3 and 4 and the capacitance of capacitor 12.

Figure 2:
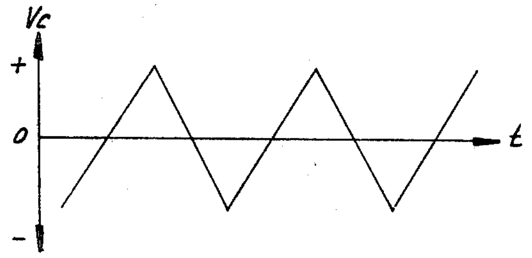
FIG. 2 is a waveform diagram that represents the voltage across the capacitor in FIG. 1 as a function of time.

The resistors in FIG. 1 and source 5 are selected so a constant charging current is supplied to capacitor 12 during each half cycle of operation. Thus, the voltage across capacitor 12 rises linearly during each half cycle of operation instead of exponentially. This permits faster frequency of operation to take place. In other words, the astable multivibrator operates in a current mode. The operation is illustrated by the triangular waveform in FIG. 2, which represents the voltage across capacitor 12 as a function of time. The peaks of one polarity in the waveform of FIG. 2 represent the regeneration that drives transistor 1 into cutoff, and the peaks of the other polarity represent the regeneration that drives transistor 2 into cutoff. The straight lines between peaks represent the periods of time during which capacitor 12 charges through resistor 3 or through resistor 4.

Crystal 13 has a parallel resonant frequency that is slightly less than the natural frequency of the astable multivibrator Preferably, this frequency is an overtone frequency rather than the fundamental frequency so the crystal may be used at a high frequency in the megahertz range without being subjected to sever internal stressing that could shatter it. Crystal 13 forces the astable multivibrator to operate at the crystal resonant frequency, which is inherently very stable. The operation of crystal 13 may be viewed on an energy basis or on an impedance basis. Crystal 13 absorbs and releases a large amount of energy at its resonant frequency. The resulting pulsations of energy cause the transistors to cutoff alternately at the same frequency by a boosting action. Alternatively, at its resonant frequency, crystal 13 has a very high impedance that serves to increase the potential at the base of the cutoff transistor, thereby forcing it prematurely into conduction.

The natural frequency of the astable multivibrator is conveniently set to a value slightly above the resonant frequency of crystal 13 by adjusting capacitor 12. Thus, the desired increment between the astable multivibrator and the resonant frequency of crystal 13 is conveniently established by a single adjustment.

I claim:

1. A stable oscillator comprising:

a first transistor having an emitter, a base, and a collector;

a second transistor having an emitter, a base, and a collector;

means for applying operating biases to the first and second transistors;

a resistive cross-coupling between the base of the first transistor and the collector of the second transistor;

a resistive cross-coupling between the base of the second transistor and the collector of the first transistor;

a capacitive cross-coupling between the emitters of the first and second transistors; and a crystal connected between the bases of the first and second transistors, the crystal having a parallel resonant frequency that is less than the natural frequency of operation absent the crystal.

2. The oscillator of claim 1, in which the capacitance of the capacitive cross-coupling is adjustable.

3. The oscillator of claim 1, in which the resonant frequency of the crystal is an overtone mode.

4. The oscillator of claim 3, in which the capacitance of the capacitive cross-coupling is adjustable.

5. The oscillator of claim 4, in which the bias providing means are adapted so the voltage across the capacitive cross-coupling increases linearly during each half cycle of operation.

6. The oscillator of claim 1, in which the bias providing means are adapted so the voltage across the capacitive cross-coupling increases linearly during each half cycle of operation.

7. A stable oscillator comprising:

an astable multivibrator having first and second active elements each with a control terminal, the active elements alternately conducting and cutting off at a natural frequency, a capacitive coupling between the active elements, the voltage across the capacitive coupling determining which active element is conducting and which active element is cut off, and means for charging and discharging the capacitive coupling such that the voltage thereacross changes linearly; and a crystal connected between the control terminals of the active elements, the crystal having a parallel resonant mode at a frequency slightly less than the natural frequency of the multivibrator.

8. The oscillator of claim 7, in which the parallel resonant mode of the crystal is an overtone.

9. The oscillator of claim 1, in which the applying means operates the first and second transistors in the current mode.

10. The oscillator of claim 1, in which the applying means applies a constant charging current to the capacitive cross-coupling